United States Patent
Kang et al.

(10) Patent No.: US 9,660,667 B2
(45) Date of Patent: May 23, 2017

(54) METHOD AND APPARATUS FOR COMPRESSING/DECOMPRESSING DATA USING FLOATING POINT

(71) Applicant: FCI INC, Seongnam-si, Gyeonggi-do (KR)

(72) Inventors: Byung Su Kang, Sungnam (KR); Beom Jin Kim, Sungnam (KR)

(73) Assignee: FCI INC, Seongnam-si, Gyeonggi-Do (KR)

( * ) Notice: Subject to any disclaimer, the term of this patent is extended or adjusted under 35 U.S.C. 154(b) by 232 days.

(21) Appl. No.: 14/579,561

(22) Filed: Dec. 22, 2014

(65) Prior Publication Data

US 2015/0180504 A1   Jun. 25, 2015

(30) Foreign Application Priority Data

Dec. 24, 2013  (KR) .................. 10-2013-0162743

(51) Int. Cl.
    *G06F 5/00*       (2006.01)
    *H03M 7/30*      (2006.01)
    *H03M 7/24*      (2006.01)

(52) U.S. Cl.
    CPC .............. *H03M 7/30* (2013.01); *H03M 7/24* (2013.01)

(58) Field of Classification Search
    None
    See application file for complete search history.

(56) References Cited

U.S. PATENT DOCUMENTS

| | | | | | |
|---|---|---|---|---|---|
| 6,131,104 | A | * | 10/2000 | Oberman | G06F 7/483 708/204 |
| 2013/0262539 | A1 | * | 10/2013 | Wegener | G06F 7/483 708/204 |
| 2015/0180504 | A1 | * | 6/2015 | Kang | H03M 7/24 708/203 |

* cited by examiner

*Primary Examiner* — David H Malzahn
(74) *Attorney, Agent, or Firm* — Hauptman Ham, LLP (57) ABSTRACT

Disclosed are a method and apparatus for compressing/decompressing data using floating points. As technology for compressing/decompressing data using floating points for efficient memory management, there are provided a method and apparatus for compressing/decompressing data using floating points, in which a log table is used to compress/decompress data, whereby not only data loss caused by compression/decompression can be minimized, but also degradation of performance can be prevented through a floating point representation even though the same number of bits are used for compression.

12 Claims, 8 Drawing Sheets

METHOD AND APPARATUS FOR COMPRESSING/DECOMPRESSING DATA USING FLOATING POINT

BACKGROUND

1. Technical Field

The present invention relates to a method and apparatus for compressing/decompressing data using floating points.

2. Description of the Related Art

The following descriptions do not constitute the related art and provides only background information related to embodiments of the present invention.

Figure 1:
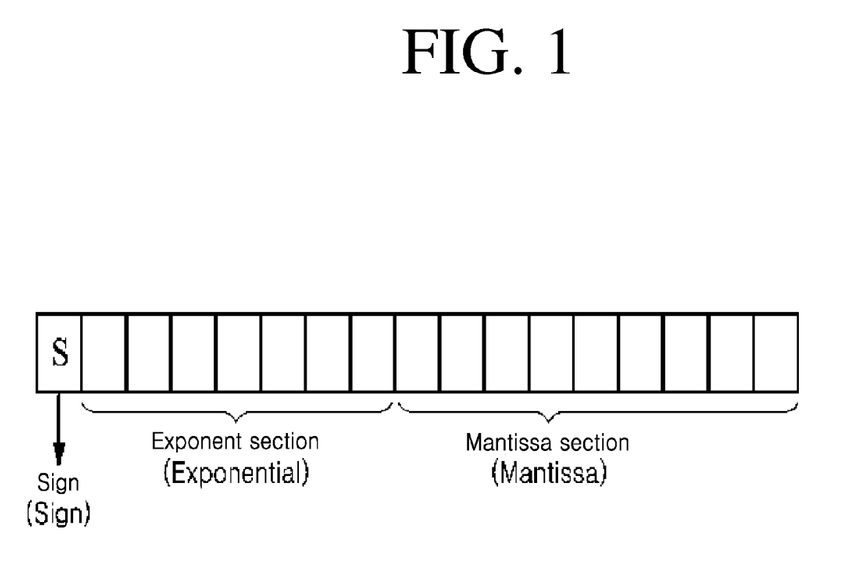
FIG. 1 shows data divided into a sign, an exponent section and a mantissa section based on a floating point representation method.

Referring to FIG. 1, a floating point method represents data in the form of a sign, an exponent section, and a mantissa section. To design a data compressor based on a method of compressing data using floating points, the number of bits in the exponent section has to be large enough to sufficiently represent the size of input to the compressor for data loss minimization, and the number of bits allocated to the mantissa section has to be sufficient to represent significant digits of actual data.

If the number of bits in the exponent section is insufficient, bit saturation occurs during a compression process and thus data is seriously distorted. Accordingly, the number of bits in the mantissa section is generally reduced in order to increase the compression ratio. However, since accuracy of the significant digits is proportional to the number of bits in the mantissa section, it is difficult to prevent data loss.

BRIEF SUMMARY

Embodiments of the present invention provide a method and apparatus for compressing/decompressing data using floating point representation for efficient memory management, in which a log table is used to compress/decompress data, whereby not only can data loss caused by compression/decompression be minimized, but also degradation of performance can be prevented through a floating point representation even though the same number of bits are used for compression.

According to one aspect of the present invention, an apparatus for compressing data includes: an input unit receiving a fixed point data bit string; a sign acquisition unit acquiring a sign bit from the fixed point data bit string; and a compression unit converting the fixed point data bit string excluding the sign bit into a floating point data bit string, in which a remaining data bit string is compressed into a mantissa section and an exponent section with a number of bits allocated according to a preset compression ratio based on a log table.

According to another aspect of the present invention, an apparatus for decompressing data includes: an input unit receiving a mantissa section, an exponent section and a sign bit corresponding to a floating point data bit string; a decompression unit extracting an output bit corresponding to a bit of the mantissa section based on an inverse log table, and generating a decompressed data bit, in which a position of the output bit is determined based on the exponent section; and a sign application unit applying the sign bit to the decompressed data bit to restore the fixed point data bit string.

According to a further another aspect of the present invention, a method of compressing data includes: receiving a fixed point data bit string; acquiring a sign bit from the fixed point data bit string; extracting a remaining data bit string excluding the sign bit from the fixed point data bit string; and performing conversion of the fixed point data bit string into a floating point data bit string, in which the remaining data bit string is compressed into a mantissa section and an exponent section with a number of bits allocated according to a preset compression ratio based on a log table.

According to yet another aspect of the present invention, an apparatus for compressing data includes: an input unit receiving different fixed point data bit strings having similarity within a preset range; and a compression unit compressing data bits of one of the different fixed point data bit strings into a first exponent section and then compressing data bits of the other fixed point data bit string into a second exponent section, calculating a difference value between the first exponent section and the second exponent section, and performing conversion of the fixed point data bit string into a floating point data bit string, in which a smaller value between the difference value and a value of the second exponent section is set to the value of the second exponent section.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Hereinafter, embodiments of the present invention will be described with reference to the accompanying drawings.

According to one embodiment of the present invention, a method of compressing/decompressing data using floating point representation may be applied to an orthogonal frequency division multiplexing (OFDM) receiver. In other words, the OFDM receiver may employ a floating point for compressing/decompressing data in order to efficiently manage a memory.

In designing the OFDM receiver, memories are frequently used in most design blocks. A memory may be used in consideration of a delay between input and output since it takes a long time to process a received signal, and, like an interleaver, use of a memory may be basically required in the system. In this case, the memory capacity is determined according to the number of bits required to represent data.

Therefore, it is important to reduce the number of data bits in order to design a receiver with a small memory.

When data is represented as floating points, significant digits corresponding to a fixed mantissa section can be represented. Therefore, if magnitude variations of data are large, it is more advantageous to use the floating point format in representation of data than a fixed point format. Based on such an advantage, the floating point may also be used to compress data represented as the fixed point. In this process, data loss can occur. The data loss can be relatively large when a data value is large, and can be small or not occur when a data value is small (there is no data loss if the data value of the fixed point can be represented by bits allocated to the mantissa section of the floating point). As such, if a relative difference between neighboring values is more important than an absolute difference between data values, the floating point representation enables significant compression of data.

Figure 2:
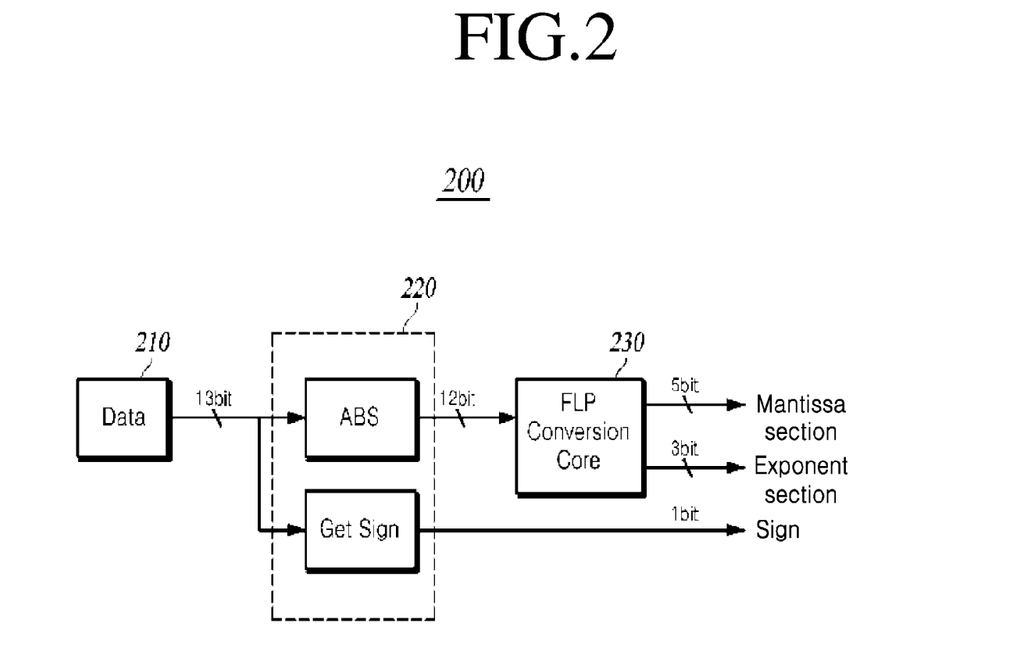
FIG. 2 shows that fixed point data is compressed into floating point data of a smaller bit number by a data compression apparatus according to one embodiment of the present invention.

FIG. 2 shows that fixed point data is compressed into floating point data with a smaller number of bits by a data compression apparatus according to one embodiment of the present invention.

According to one embodiment of the invention, compression of fixed point data into floating point data of a smaller number of bits by a data compression apparatus may be achieved by a data compression apparatus 200. The data compression apparatus 200 may be used for memory management of the OFDM receiver. The data compression apparatus 200 may include an input unit 210, a sign acquisition unit 220, and a compression unit 230. However, the components of the data compression apparatus 200 are not limited thereto.

Next, the components of the data compression apparatus 200 will be described.

The input unit 210 receives a fixed point data bit string. For example, assuming that fixed point data is 13 bits, the input unit 210 receives fixed point data of 13 bits and sends the fixed point data to the sign acquisition unit 220.

The sign acquisition unit 220 acquires a sign bit from the fixed point data bit string. For example, the sign acquisition unit 220 receives fixed point data of 13 bits from the input unit 210. Then, the sign acquisition unit 220 acquires a sign of 1 bit from the fixed point data of 13 bits.

The compression unit 230 converts the fixed point data bit string excluding the sign bit into a floating point data bit string, in which the remaining data bit string excluding the sign bit is compressed into a mantissa section and an exponent section with a number of bits allocated according to a preset compression ratio based on a log table 340. For example, it is assumed that 5 bits are allocated to the mantissa section and 3 bits are allocated to the exponent section according to a preset compression ratio. In other words, the compression unit 230 may convert a fixed point data bit string of 13 bits into a floating point data bit string, in which the data bit string of 12 bits excluding the sign bit is compressed into a mantissa section of 5 bits and an exponent section of 3 bits based on the log table 340. Such operation of the compression unit 230 will be described in detail with reference to FIG. 3.

As shown in FIG. 2, fixed point data can be compressed into floating point data having a smaller number of bits. For example, as shown in FIG. 2, a floating point input of 13 bits received from the input unit 210 may be compressed into an output of 9 bits in total, i.e. a sign of 1 bit, a mantissa section of 5 bits, and an exponent section of 3 bits.

The "FLT conversion core" (i.e. the compression unit 230) shown in FIG. 2 detects the initial position where '1' is first present after the sign bit in input binary data, determines the value of the exponent section based on the initial position, and outputs mantissa section data. In general, the mantissa section data is directly output corresponding to the number of bits in the mantissa section from the detected initial position. In the case where the mantissa section data is determined by the foregoing method, data loss occurs since the number of output significant digits is small when the mantissa section has a small number of bits. Such loss relatively increases as the value included in the mantissa section becomes smaller. Therefore, in this embodiment, the log table 340 is employed to determine the data of the mantissa section.

In the data compression apparatus 200 using floating point representation, if the number of bits of the mantissa section is restricted in order to increase the compression ratio, it is possible to minimize loss of data not represented in the mantissa section. As described above, since data loss caused by compression increases with decreasing bit value included in the mantissa section, the data compression apparatus 200 may use the log table 340 to more accurately represent small numbers.

Figure 3:
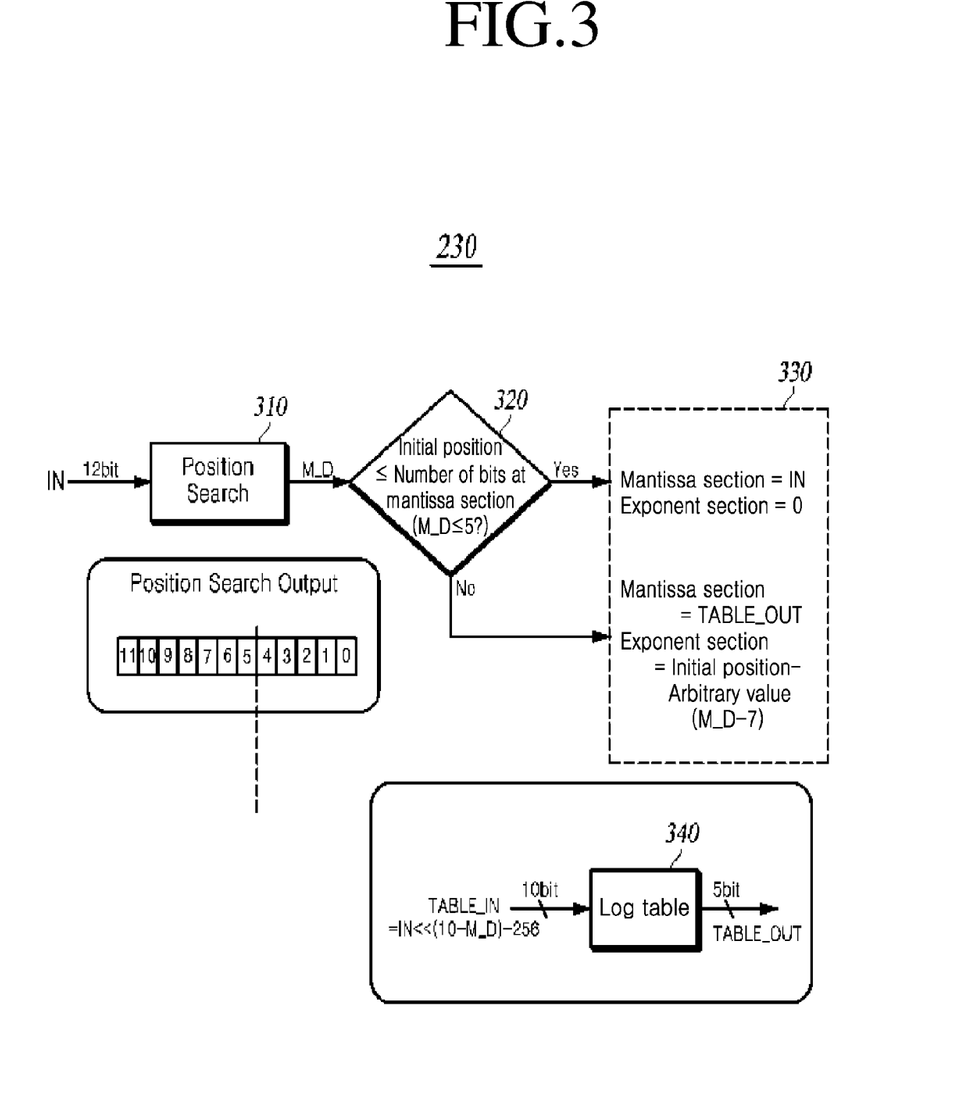
FIG. 3 shows a floating point conversion method according to one embodiment of the present invention, in which a compression unit employs a log table.

FIG. 3 shows a floating point conversion method according to one embodiment of the present invention, in which a compression unit employs a log table.

The compression unit 230 includes an extractor 310, a comparator 320, a floating point converter 330, and the log table 340.

The extractor 310 detects an initial position where '1' is first present after the sign bit in a binary number included in the remaining data bit string. The extractor 310 detects the initial position where '1' is first present after the sign bit in the binary number contained in the remaining data bit string of 12 bits. As shown in FIG. 3, the extractor 310 may indicate a position value for the initial position among positions '11, 10, 9, 8, 7, 6, 5, 4, 3, 2, 1, 0' of 12 bits.

The comparator 320 determines whether the number of bits at the initial position detected by the extractor 310 is equal to or less than the number of bits allocated to the mantissa section. For example, when 5 bits are allocated to the mantissa section, the comparator 320 determines that the initial position ≤5. If the initial position detected by the extractor 310 is '3', the comparator 320 determines whether '3≤5'. In addition, if the initial position is '10', the comparator 320 determines whether '10 ≤5'.

The floating point converter 330 compresses the remaining data bit string into a mantissa section and an exponent section based on the determination results of the comparator 320. In other words, if the comparator 320 has determined that the number of bits at the initial position is equal to or less than the number of bits in the mantissa section, the floating point converter 330 sets the bit at the initial position and subsequent bits thereof in the remaining data bit string as the bits of the mantissa section without modification. Then, the floating point converter 330 sets all the bits of the exponent section to 0. For example, if the initial position detected by the extractor 310 is a position of '3', the comparator 320 determines whether '3≤5' and recognizes that the number of bits at the initial position is equal to or less than the number of bits in the mantissa section as the determination results. In this case, the floating point converter 330 recognizes that the initial position is included in the number of bits in the mantissa section and sets the bit at the initial position and subsequent bits thereof as the bits of the mantissa section without modification. Then, the floating point converter 330 sets all the bits of the exponent section to 0.

If the comparator 320 determines that the number of bits at the initial position exceeds the number of bits in the mantissa section, the floating point converter 330 extracts bits subsequent to the bit at the initial position from the remaining data bit string as input bits. For example, if the initial position detected by the extractor 310 is a position of '10', the comparator 320 determines whether '10≤5' and recognizes that the number of bits at the initial position exceeds the number of bits in the mantissa section. In this case, the floating point converter 330 outputs bits subsequent to the bit at the initial position (excluding the bit at the initial position) as input bits.

The floating point converter 330 sets the length of the input bits to a preset number of bits, and extracts output bits corresponding to the input bits based on the log table. The floating point converter 330 sets the output bits as the bits of the mantissa section. For example, if the number of bits after the initial position is 10 in total, the floating point converter 330 uses the log table to extract output bits corresponding to the input of 10 bits. The length of the output bits may be 5 in bits, i.e. the number of bits allocated to the mantissa section. Then, the floating point converter 330 may set the five output bits as the bits of the mantissa section.

The floating point converter 330 may set the length of the output bits to a preset number of bits (e.g., 10 bits) if the bits after the initial position are 8 in total. At this time, the floating point converter 330 may set the length of the output bits to the preset number (10 bits) by inserting '0' in positions after the 8 bits. Then, the floating point converter 330 uses the log table to extract output bits corresponding to the input of 10 bits. The length of the output bits may be 5 bits, i.e. the number of bits allocated to the mantissa section. Then, the floating point converter 330 may set the five output bits as the bits of the mantissa section.

If the comparator 320 determines that the number of bits at the initial position exceeds the number of bits in the mantissa section, the floating point converter 330 sets a value corresponding to the initial position as the bits of the exponent section. In other words, the floating point converter 330 may subtract an arbitrary value from the initial position so as to obtain 3 bits, i.e. the number of bits allocated to the exponent section. For example, if the initial position corresponds to '10', an arbitrary value is set to '7', so that 3 bits, i.e. the number of bits allocated to the exponent section, can be obtained by calculating '10−7'. In the case of 3 bits, i.e. the number of bits allocated to the exponent section, a maximum value of '7' can be represented using 3 bits in a binary number, and thus the bit positions after the sign bit may be set respectively to '7', '6', '5', '4', '3', '2', '1', '0'. For example, if the bit first positioned after the sign bit is '1', a value corresponding to '7' may be set and thus a binary number of '111' may be set in the exponent section. If the bit first positioned after the sign bit is '0' and the next bit is '1', a value corresponding to '6' may be set and thus a binary number of '110' may be set in the exponent section. The number of bits allocated to the exponent section may be varied depending on the preset compression ratio, and the value to be set may also be varied depending on the number of bits allocated to the exponent section. If 4 bits are allocated to the exponent section, '15' to '0' may be set. If 2 bits are allocated thereto, '3' to '0' may be set.

The log table 340 tabulates and stores values calculated using a convex function according to the preset number of bits. For example, the log table 340 applies a function (e.g., the convex function) more convex than a function of 'y=x' to an input value of 10 bits, and tabulates and stores a 5-bit result value. The function applied by the log table 340 may be properly selected according to conditions among functions (e.g., the convex function) more convex than the function of 'y=x'. The reason for using the convex function is to more accurately represent a value as the bit value included in the mantissa section becomes smaller, thereby reducing data loss.

To summarize the foregoing process described with reference to FIG. 3, when an input of 12 bits excluding the sign bit is received in the extractor 310, the initial position where '1' is first present after the sign bit in the binary number included in the remaining data bit string is detected. Next, the comparator 320 compares the initial position with the number of bits allocated to the mantissa section. Then, if it is determined by the comparator 320 that the number of bits at the initial position is equal to or less than the number of bits (e.g., 5) of the mantissa section, the floating point converter 330 sets the input value to the mantissa section without modification, and sets the bit value of the exponent section to 0. On the other hand, if it is determined by the comparator 320 that the number of bits at the initial position exceeds the number of bits of the mantissa section, the floating point converter 330 applies 10 bits from the bits after the initial position to the table and outputs the table to the mantissa section, and sets the value of the exponent section to the result of (the initial position −7). The function used in the log table 340 may be properly selected and used according to conditions among functions (e.g., the convex function) more convex than the function of 'y=x'. The reason for using the convex function is to more accurately represent a value as the bit value included in the mantissa section becomes smaller, thereby reducing data loss. For reference, FIG. 3 shows an example of tabulating inputs from 1 to 2 of a logarithmic function with base 2 (where the base indicates 'a' in a logarithmic function of 'y=log$_a$x' or an exponential function of 'y=a$^x$').

Figure 4:
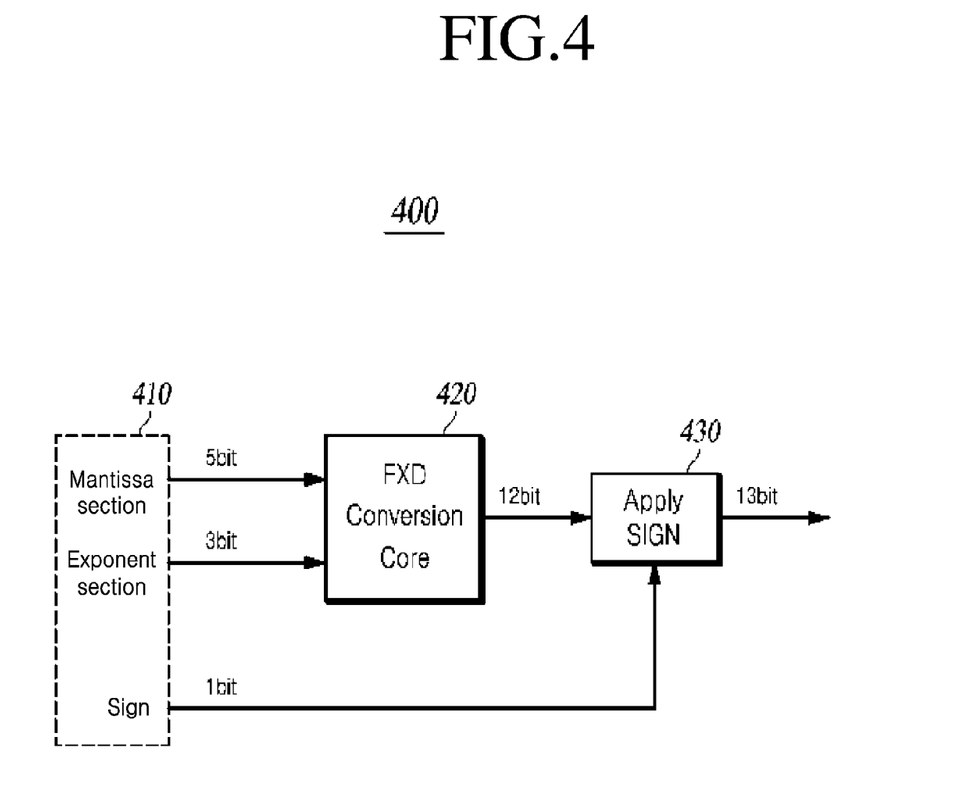
FIG. 4 shows that data compressed and converted in the form of a floating point is restored to original fixed point data by a data decompression apparatus according to one embodiment of the present invention.

FIG. 4 shows that data compressed and converted in the form of a floating point is restored to original fixed point data by a data decompression apparatus according to one embodiment of the present invention.

According to one embodiment of the invention, a method of restoring data compressed and converted in the form of floating points to original fixed point data may be achieved by a data decompression apparatus 400. The data decompression apparatus 400 may be used for memory management of the OFDM receiver. The data decompression apparatus 400 may include an input unit 410, a decompression unit 420, and a sign application unit 430. However, the components of the data decompression apparatus 400 are not limited thereto.

The input unit 410 receives a mantissa section, an exponent section, and a sign bit corresponding to a floating point data bit string. For example, the input unit 410 receives the floating point data bit string that includes a mantissa section of 5 bits, an exponent section of 3 bits, and a sign of 1 bit.

The decompression unit 420 (i.e., the FXD conversion core) extracts output bits corresponding to the bits of the mantissa section based on an inverse log table, and generates decompressed data bits, in which a position of the output bits is determined based on the exponent section. For example, the decompression unit 420 determines an initial position based on the exponent section of 3 bits. The decompression unit 420 extracts the output of 10 bits corresponding to the mantissa section of 5 bits through the inverse log table. Then, the decompression unit 420 can generate decompressed data bits in which the output of 10 bits is inserted as the bits following an initial position. At this time, it is possible to generate the decompressed data with 12 bits in total according to the initial position.

The inverse log table uses a concave function to tabulate and store values calculated according to a preset number of bits. For example, the inverse log table applies a function (e.g., the concave function) more concave than the function of 'y=x' to an input value of 5 bits and tabulates and stores a 10-bit result value. The function applied by the log table 340 may be properly selected according to conditions among functions (e.g., the concave function) more concave than the function of 'y=x'. The reason for using the concave function is to restore the compressed data to the original value through an inverse function to the convex function, since the convex function is used to more accurately represent a value as the bit value included in the mantissa section becomes smaller, thereby reducing data loss.

The sign application unit 430 applies the sign bit to the decompressed data bit, thereby restoring the fixed point data. For example, the sign application unit 430 applies the sign of 1 bit to the decompressed data bit of 12 bits, thereby restoring the fixed point data having a bit string of 13 bits.

The method of decompressing the data described with reference to FIG. 4 may be achieved in reverse order to the method of compressing the data described with reference to FIGS. 2 and 3. In other words, FIG. 4 shows one embodiment in which the data compressed and converted in the form of floating points is restored to the original fixed point data. When the data is converted using the table proposed in the embodiment of the invention, the inverse log table may be used to restore the converted data to the original value.

Figure 5:
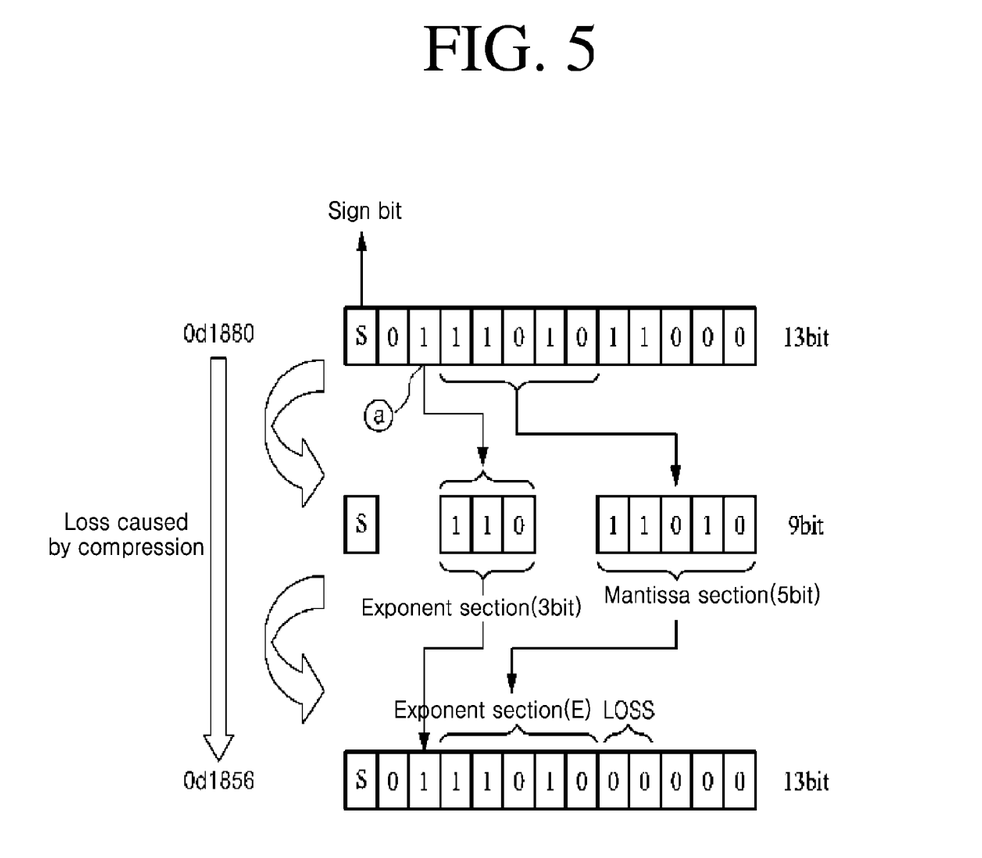
FIGS. 5 to 7 are views explaining a process of converting fixed point data into floating point data according to one embodiment of the present invention.
Figure 6:
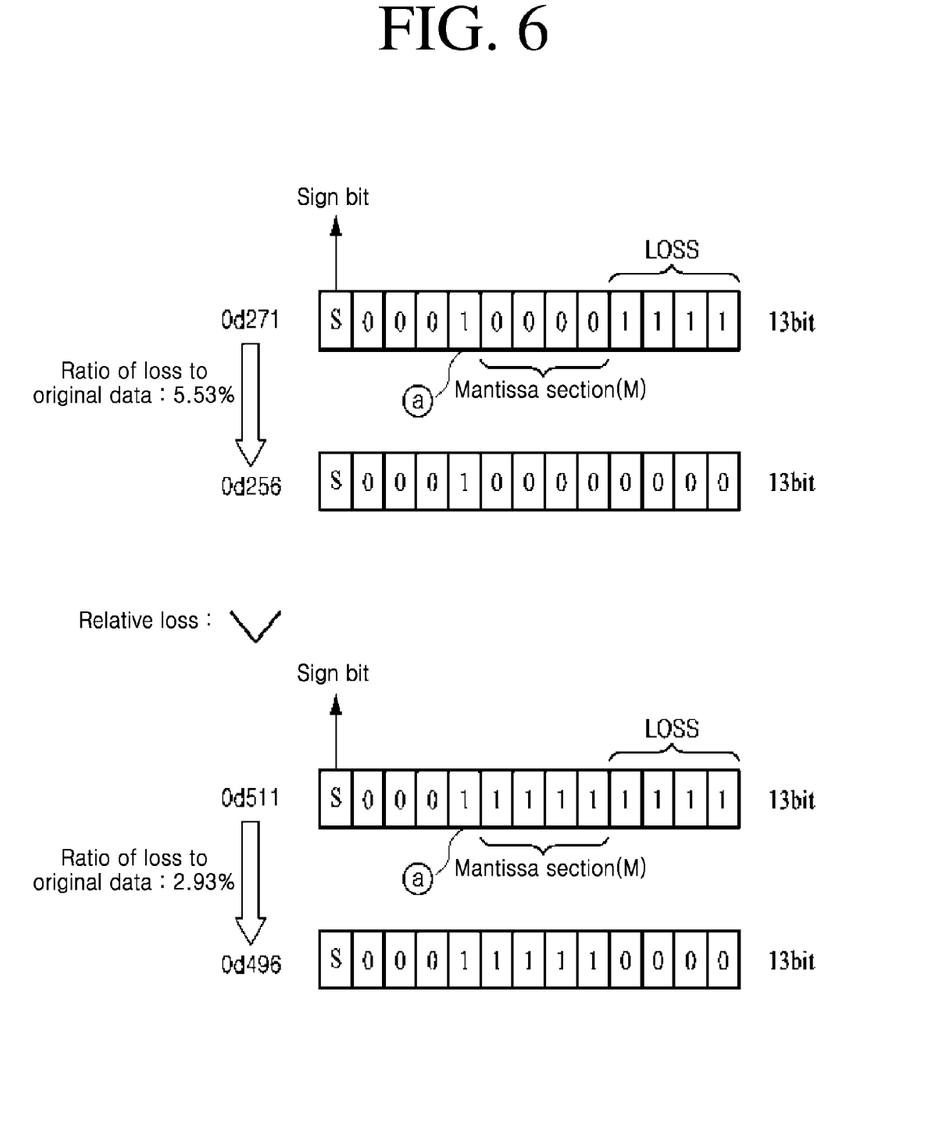
Figure 7:
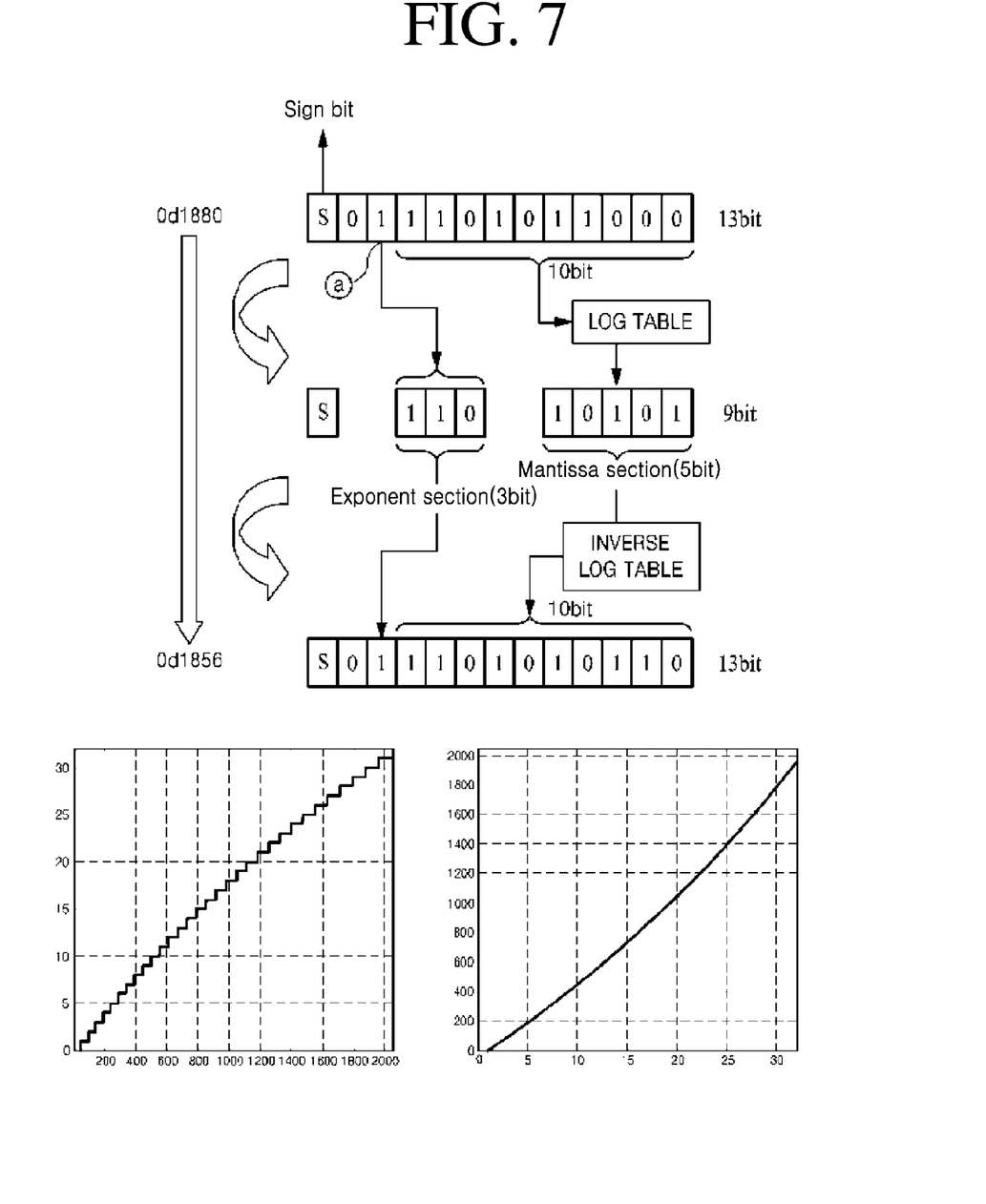

FIGS. 5 to 7 are views explaining a process of converting fixed point data into floating point data according to one embodiment of the present invention.

As shown in FIG. 5, if a fixed point data bit string with 13 bits allocated is input, the fixed point data bit string is converted into floating point data bit string by general data compression as follows.

1 bit is allocated to a sign bit in the fixed point data bit string with 13 bits allocated. Then, an initial position ⓐ where '1' is first present after the sign bit in a binary number included in the remaining data bit string is detected from 12 bits in total as obtained by excluding the sign of 1 bit from 13 bits. For example, since 'S' is the sign bit in 'S011101011000' of 13 bits, the initial position ⓐ where '1' is first present after the sign bit in the binary number included in the remaining data bit string is detected from a total of 12 bits of '011101011000' excluding 'S'. If it is assumed that 3 bits are allocated to the exponent section and 5 bits are allocated to the mantissa section, 5 bits following the initial position ⓐ are set to the mantissa section with respect to the initial position ⓐ within 12 bits. For example, since 5 bits are allocated to the mantissa section, '11010' corresponding to 5 bits subsequent to the initial position ⓐ are set to the mantissa section within '011101011000' of 12 bits.

Further, a value corresponding to the initial position ⓐ within 12 bits is set to the exponent section of 3 bits. Since 3 bits are allocated to the exponent section, it can be represented as the maximum of '7' in the binary number. Therefore, the bits present after the sign bit may be set to values sequentially corresponding to '7', '6', '5', '4', '3', '2', '1' and '0'. For example, if the bit first present after the sign bit is '1', a value corresponding to '7' may be set to thereby set a binary number of '111' in the exponent section of 3 bits. In addition, if the bit first present after the sign bit is '0' and the next bit is '1', a value corresponding to '6' may be set to thereby set a binary number of '110' in the exponent section of 3 bits.

Next, a process of restoring the floating point data bit string to the fixed point data bit string will be described. The initial position ⓐ is determined based on a value corresponding to '110', i.e. 3 bits of the exponent section. Then, '11010', i.e. 5 bits allocated to the mantissa section, are allocated to the bits after the initial position ⓐ, and the following bits are all set to 0, thereby restoring the fixed point data. At this time, after the mantissa section is allocated to the bits after the initial position ⓐ, the following given bits are all set to 0, thereby causing loss. The method shown in FIG. 6 also causes loss like that described with reference to FIG. 5. However, according to one embodiment of the present invention, as shown in FIG. 7, the fixed point data bit string of 'S011101011000' allocated 13 bits is input, and then the sign bit of 'S' is acquired from 'S011101011000' of 13 bits. From '011101011000' of a total of 12 bits acquired by excluding the sign bit of 'S' from 'S011101011000' of 13 bits, the initial position ⓐ where '1' is first present after the sign bit is detected. It will be assumed that 3 bits are allocated to the exponent section and 5 bits are allocated to the mantissa section. Within '011101011000' of a total of 12 bits, 10 bits, i.e. '1101011000' after the initial position ⓐ are input as the input bits to the log table 340. Then, '10101' allocated 5 bits are set to the mantissa section as the output value corresponding to '10 bits', i.e. '1101011000'. As shown in FIG. 7, the log table may store and tabulate the values calculated according to the preset number of bits using the convex function.

Further, within 12 bits, the value corresponding to the initial position ⓐ is set to the exponent section of 3 bits. For example, since 3 bits are allocated to the exponent section, 3 bits, i.e. '110' after the initial position ⓐ within 12 bits of '011101011000' are set to the exponent section. Since 3 bits are allocated to the exponent section, 3 bits can be represented as '7'. Therefore, the bits present after the sign bit may be set to values sequentially corresponding to '7', '6', '5', '4', '3', '2', '1', '0'. As shown in FIG. 7, when the bit first present the sign bit is '0' and the next bit is '1', a value corresponding to '6' may be set and thus '110' may be set to the exponent section.

Next, a process of restoring the floating point data bit string to the fixed point data bit string will be described. The initial position ⓐ is determined based on a value corresponding to '110', i.e. 3 bits of the exponent section. Then, 5 bits, i.e. '10101' allocated to the mantissa section are input to the inverse log table. Then, the fixed point data is restored in such a manner that '1101010110' allocated 10 bits as an output value corresponding to 5 bits, i.e. '10101' are allocated to bits after the initial position ⓐ. At this time, since the output values using the inverse log table are allocated to the bits after the initial position ⓐ, it is possible to reduce data loss. As shown in FIG. 7, the inverse log table may store and tabulate the values calculated according to a preset number of bits using the convex function.

Figure 8:
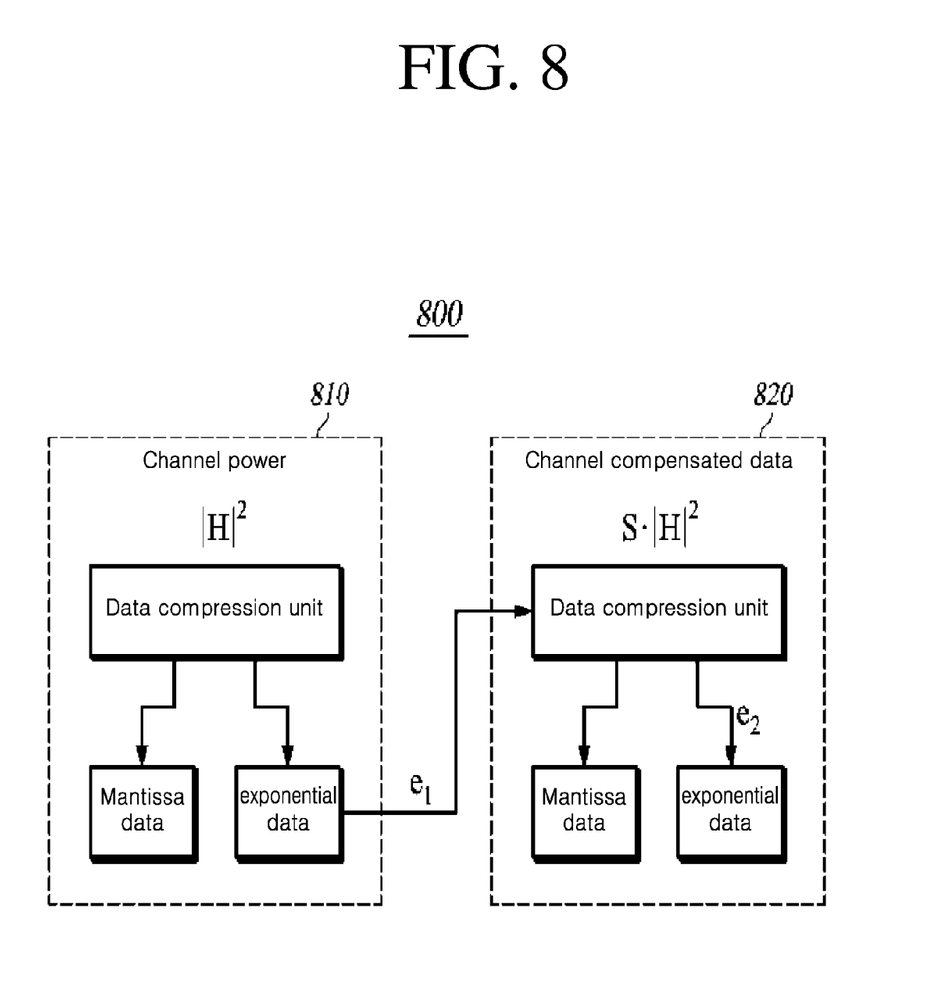
FIG. 8 shows a process of converting fixed point data into floating point data based on similarity between data according to another embodiment of the present invention.

FIG. 8 shows a process of converting fixed point data into floating point data based on similarity between data according to another embodiment of the present invention.

According to another embodiment of the present invention, a method of converting fixed point data into floating point data based on similarity between data may be achieved by a data compression apparatus 800. The data compression apparatus 800 may be used for memory management of the OFDM receiver. The data compression apparatus 800 may include a first compression unit 810 and a second compression unit 820. However, the components of the data compression apparatus 800 are not limited thereto.

The data compression apparatus 800 receives different fixed point data bit strings having similarity within a preset range through the input unit.

The first compression unit 810 acquires a first sign bit from one of the different fixed point data bit strings. The first compression unit 810 detects an initial position where '1' is first present after the sign bit in the binary number included in the remaining data bit string. The first compression unit 810 performs compression such that a first mantissa section and a first exponent section can have the number of bits allocated according to a preset compression ratio based on the initial position.

The second compression unit 820 acquires a second sign bit from the other fixed point data bit strings. The second compression unit 820 detects an initial position where '1' is first present after the second sign bit in the binary number included in the remaining data bit string excluding the second sign bit. The second compression unit 820 performs compression such that a second mantissa section and a second exponent section can have the number of bits allocated according to the compression ratio based on the initial position. Then, the second compression unit 820 calculates a difference value between the first exponent section and the second exponent section, and converts the fixed point data string into a floating point data bit string where a smaller value between the calculated difference value and a value of the second exponent section is set to the value of the second exponent section.

Such a method of compressing data using similarity between data is applied to the OFDM receiver, thereby reducing the number of bits of the exponent section. For example, if channel-compensated data and a channel value are both stored in a memory (two data values are similar within a preset range), these data have similar sizes since both data are multiplied with the channel even though these data values are different from each other. If two pieces of data are converted by the floating point method based on the characteristics of the similar size, it is possible to reduce the number of bits of the exponent section. In other words, assuming that two pieces of data to be converted are respectively A and B, a bit value allocated to the exponent section acquired from B is not much different from a bit value allocated to the exponent section acquired from A. Thus, it is possible to reduce the number of bits of the exponent section by representing the difference therebetween with a smaller number of bits.

As shown in FIG. 8, when two different data are compressed at the same time, a result from one compression unit is used for the other compression unit based on similarity between the data. In other words, based on the fact that two pieces of data (A and B) have a similar size, instead of directly using a value $e_2$ of the second exponent section, a difference between the value $e_2$ and a value $e_1$ of the first exponent section is output, thereby reducing the number of bits for representing the data of the second exponent section.

As described above, embodiments of the present invention provides a technique for compressing/decompressing data using floating point representation for efficient memory management, in which a log table is used to compress/decompress data, whereby not only can data loss caused by compression/decompression be minimized, but also degradation of performance can be prevented through a floating point representation even though the same number of bits are used for compression.

In addition, embodiments of the present invention enable designs of an OFDM receiver to compress data in blocks using a memory, thereby providing an effect of reducing the size of memory to be used. In addition, fixed point data is converted into floating point data using a log table for determining data of the exponent section, thereby providing an effect of reducing loss of original data.

Further, when plural pieces of data are converted at the same time, it is possible to reduce the number of bits based on similarity between data.

Although some exemplary embodiments have been described herein, it should be understood that the foregoing embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

What is claimed is:

1. An apparatus for compressing data, comprising:
   an input unit receiving a fixed point data bit string;
   a sign acquisition unit acquiring a sign bit from the fixed point data bit string; and
   a compression unit converting, into a floating point data bit string, a remaining data bit string of the fixed point data bit string excluding the sign bit, wherein the remaining data bit string is compressed into a mantissa section and an exponent section with a number of bits allocated according to a preset compression ratio based on a log table, wherein the log table uses a convex function to tabulate values according to a preset number of bits.

2. The apparatus according to claim 1, wherein the compression unit comprises:
   an extractor detecting an initial position where '1' is first present after the sign bit in a binary number included in the remaining data bit string;
   a comparator determining whether the number of bits at the initial position is equal to or less than the number of bits allocated to the mantissa section; and
   a floating point converter compressing the remaining data bit string into the mantissa section and the exponent section based on the determination result of the comparator.

3. The apparatus according to claim 2, wherein, if the comparator determines that the number of bits at the initial position is equal to or less than the number of bits of the mantissa section, the floating point converter sets the bit at the initial position and subsequent bits thereof in the remaining data bit string as the bits of the mantissa section without modification, and sets all of the bits of the exponent section to 0.

4. The apparatus according to claim 2, wherein if the comparator determines that the number of bits at the initial position exceeds the number of bits of the mantissa section, the floating point converter extracts bits subsequent to the bit at the initial position from the remaining data bit string as input bits, extracts output bits corresponding to the input bits through the log table after the number of input bits is set to the preset number of bits, and sets the output bits as the bits of the mantissa section.

5. The apparatus according to claim 2, wherein, if the comparator determines that the number of bits at the initial position exceeds the number of bits of the mantissa section, the floating point converter sets a value corresponding to the initial position as bits of the exponent section.

6. An apparatus for decompressing data, comprising:
an input unit receiving a mantissa section, an exponent section and a sign bit corresponding to a floating point data bit string;
a decompression unit extracting an output bit corresponding to a bit of the mantissa section based on an inverse log table, and generating a decompressed data bit, in which a position of the output bit is determined based on the exponent section, wherein the inverse log table uses a concave function to tabulate values according to a preset number of bits; and
a sign application unit applying the sign bit to the decompressed data bit, thereby a fixed point data bit string with the decompressed data bit and the sign bit is restored to an original value.

7. A method of compressing data, comprising:
receiving a fixed point data bit string;
acquiring a sign bit from the fixed point data bit string;
extracting a remaining data bit string, excluding the sign bit, from the fixed point data bit string; and
performing conversion of the fixed point data bit string into a floating point data bit string, in which the remaining data bit string is compressed into a mantissa section and an exponent section with a number of bits allocated according to a preset compression ratio based on a log table, wherein the log table uses a convex function to tabulate values according to a preset number of bits.

8. The method according to claim 7, wherein performing conversion of the fixed point data bit string comprises:
detecting an initial position where '1' is first present after the sign bit in a binary number included in the remaining data bit string;
determining whether the number of bits at the initial position is equal to or less than the number of bits allocated to the mantissa section; and
compressing the remaining data bit string into the mantissa section and the exponent section based on the determination result.

9. The method according to claim 8, wherein compressing the remaining data bit string comprises:
equally setting the bit at the initial position and subsequent bits thereof in the remaining data bit string as the bits of the mantissa section if the number of bits at the initial position is equal to or less than the number of bits of the mantissa section; and
setting all of the bits of the exponent section to 0.

10. The method according to claim 8, wherein compressing the remaining data bit string comprises:
extracting bits subsequent to the bit at the initial position from the remaining data bit string as input bits, if the number of bits at the initial position exceeds the number of bits of the mantissa section;
setting the number of input bits to a preset number of bits;
extracting output bits corresponding to the input bits through the log table and setting the output bits as the bits of the mantissa section; and
setting a value corresponding to the initial position as bits of the exponent section.

11. An apparatus for compressing data, comprising:
an input unit receiving different fixed point data bit strings having similarity within a preset range; and
a compression unit compressing data bits of one of the different fixed point data bit strings into a first exponent section and then compressing data bits of the other fixed point data bit string into a second exponent section, calculating a difference value between the first exponent section and the second exponent section, and performing conversion of the different fixed point data bit strings into a floating point data bit string, determining which value is a smaller value between the difference value and a value of the second exponent section, and setting the smaller value to the value of the second exponent section.

12. The method according to claim 11, wherein the compression unit comprises:
a first compression unit which acquires a first sign bit from one fixed point data bit string, detects an initial position from a remaining data bit string, excluding the first sign bit, from the one fixed point data bit string, performs compression such that each of a first mantissa section and a first exponent section have the number of bits allocated according to a preset compression ratio and based on the initial position; and
a second compression unit which acquires a second sign bit from the other fixed point data bit string, detects an initial position from the remaining data bit string excluding the second sign bit in the other fixed point data bit string, and performs compression such that each of a second mantissa section and a second exponent section have the number of bits allocated according to the compression ratio and based on the initial position.

* * * * *